(12) United States Patent
Lu et al.

(10) Patent No.: US 8,536,741 B2
(45) Date of Patent: Sep. 17, 2013

(54) THERMOSTATICALLY CONTROLLED TERMINAL BOX AND PHOTOVOLTAIC POWER GENERATION SYSTEM UTILIZING THE SAME

(75) Inventors: Hui-Ming Lu, Taipei Hsien (TW); Hui-Chuan Chen, Taipei Hsien (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 790 days.

(21) Appl. No.: 12/768,743

(22) Filed: Apr. 28, 2010

(65) Prior Publication Data

US 2011/0240100 A1    Oct. 6, 2011

(30) Foreign Application Priority Data

Apr. 6, 2010 (CN) ...................... 2010 2 0149865 U (51) Int. Cl.
*H01H 35/14* (2006.01)
(52) U.S. Cl.
USPC .......................................................... 307/117
(58) Field of Classification Search
USPC .......................................................... 307/117
See application file for complete search history.

(56) References Cited

U.S. PATENT DOCUMENTS

5,688,337 A    11/1997    Mosher

*Primary Examiner* — Robert L. DeBeradinis
(74) *Attorney, Agent, or Firm* — Altis Law Group, Inc.

(57) ABSTRACT

A system comprising a photovoltaic module and a terminal box. Two terminals of the box output voltage generated by the photovoltaic module. A thermal switch shorts the two terminals in response to temperature rise to a threshold temperature and is structured to prevent short-circuit due to the temperature rise of the normally operating photovoltaic module and bypass diodes in the terminal box.

20 Claims, 9 Drawing Sheets

THERMOSTATICALLY CONTROLLED TERMINAL BOX AND PHOTOVOLTAIC POWER GENERATION SYSTEM UTILIZING THE SAME

BACKGROUND

1. Technical Field

The disclosure relates to photovoltaic power generation, and more particularly to thermostatically controlled junction boxes and photovoltaic power generation systems utilizing the same.

2. Description of Related Art

Photocells providing renewable emission-free electrical power have become increasingly popular. Residential users often install solar panels on a roof to achieve maximum efficiency of light absorption. An on-grid solar power roof system provides electrical power for home use and feeds excess power to the power grid exposed to unobstructed sunlight.

A solar power system that is exposed to unobstructed sunlight maintains a relatively high voltage, whereby damage to the system may create hazards from power leaks. For example, in the event of a fire, unimpeded voltage from solar panels may impair firefighting efforts. Many currently used solar power systems do not provide a shutdown capability in to the event of fire or other events.

DETAILED DESCRIPTION

Description of exemplary embodiments of thermostatically controlled terminal box boxes and photovoltaic power generation systems utilizing the same is given in the following paragraphs which are organized as:

1. System Overview
   1.1 Terminal Box
   1.2 Photovoltaic Power Generation System
2. Exemplary Embodiments of Thermal Switches
   2.1 First Exemplary Embodiment of the Terminal Box with Mechanical Thermal Switches
   2.2 Second Exemplary Embodiment of the Terminal Box with Electrical Thermal Switches
   2.3 Third Exemplary Embodiment of the Terminal Box with Electrical Thermal Switches
3. Alternative embodiments
4. Conclusion

1. SYSTEM OVERVIEW

Connection described in the following refers to electrical connection via electrical conductive contacts, wiring, or metal soldering. The electrical conductive contacts may be fastened and restrained by metal screws or clamps. Photovoltaic cells described in the following generate voltage signals when exposed to radiant energy and may be made from monocrystalline silicon, polycrystalline silicon, microcrystalline silicon, cadmium telluride (CdTe), copper indium selenide/sulfide (CIS), copper indium gallium (di)selenide (CIGS), or other materials.

1.1 Terminal Box

Figure 1:
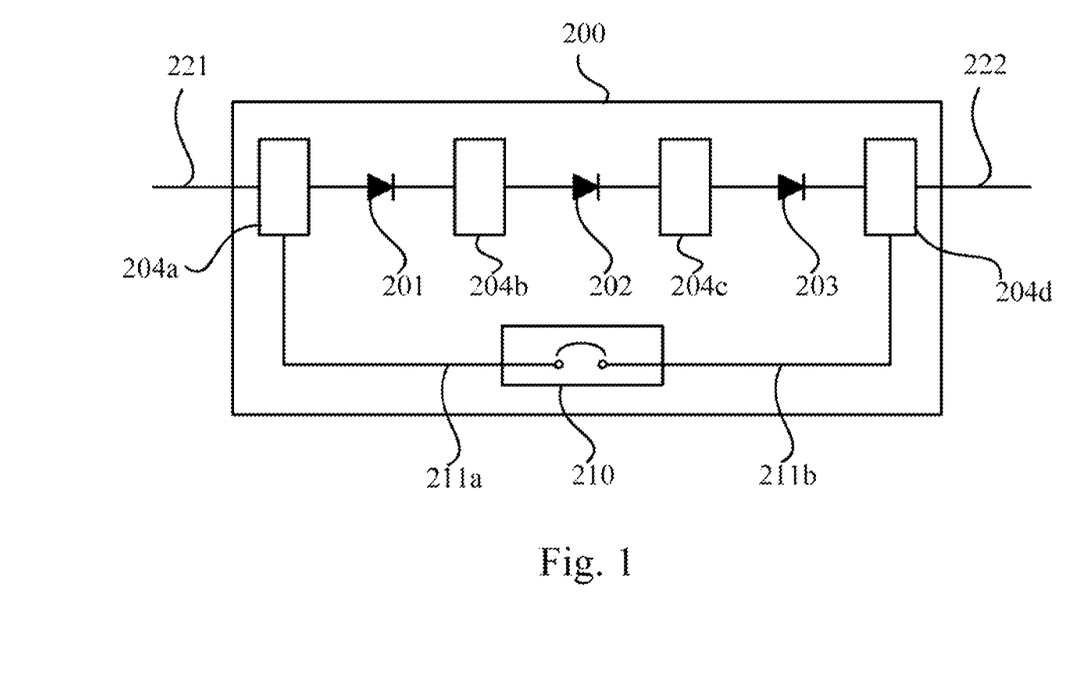
FIG. 1 is a block diagram of an exemplary embodiment of a photovoltaic terminal box.
Figure 2:
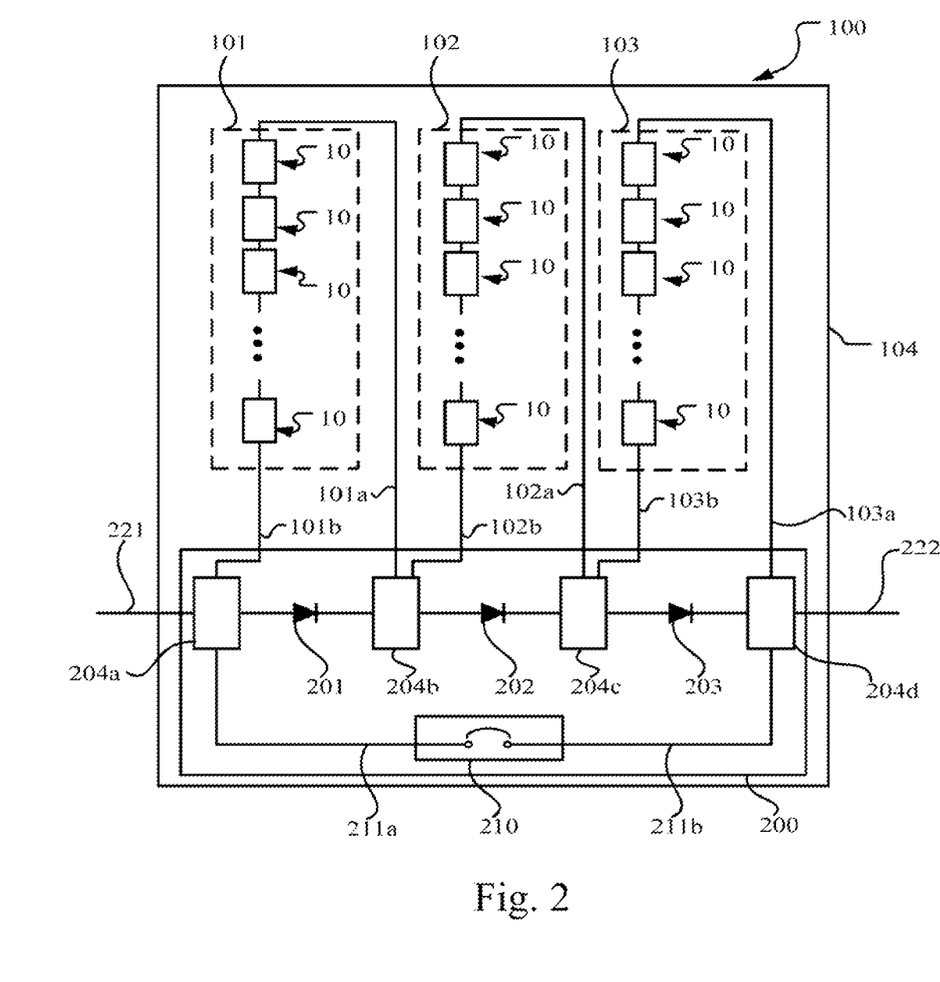
FIG. 2 is a block diagram of an exemplary embodiment of a photovoltaic module.

With reference to FIGS. 1 and 2, a terminal box (or junction box) 200 is utilized for a photovoltaic system comprising a photovoltaic module 100. The photovoltaic module 100 comprises a plurality of photovoltaic cells 10 electrically connected in series and grouped as sets 101, 102, and 103. Two output terminals of a set of photovoltaic cells provide relatively high voltage signals and low voltage signals are referred to as a positive terminal and a negative terminal, respectively. For example, each set of photovoltaic cells can provide about 12 v across the positive and negative terminals. Positive terminals of the sets 101, 102, and 103 operable to supply relatively high voltage signals are respectively labeled as 101a, 102a, and 103a, and negative terminals of the sets 101, 102, and 103 operable to supply relatively low voltage signals are respectively labeled as 101b, 102b, and 103b. The cells 10 of the photovoltaic module 100 are attached to a first surface of a panel 104. A terminal box 200 is attached to a second surface of the panel 104 opposite to the first surface.

In the terminal box 200, the anode of bypass diode 201 is connected to a conductive component 204a, and the cathode of bypass diode 201 is connected to a conductive component 204b. Similarly, the anode and cathode of bypass diode 202 are respectively connected to conductive components 204b and 204c, and the anode and cathode of bypass diode 203 are respectively connected to conductive components 204c and 204d. Each of the conductive components 204a, 204b, 204c, and 204d may comprise a wire, a connector, an electrically conductive heat sink, or a combination thereof. Each of the bypass diodes 201-203 may raise temperature when the set of photovoltaic cells connected to the diode is shaded from solar radiation. The operating temperature of each of the bypass diodes 201-203 may be limited to less than a upper limit 120° C.

The negative terminal 101b of the set 101 is connected to the conductive component 204a, and a positive terminal 101a is connected to the conductive component 204b. Thus, the set 101 of photovoltaic cells is connected in parallel with a bypass diode 201. Similarly, as shown in FIG. 1, a negative terminal 102b and a positive terminal 102a of the set 102 are respectively connected to the conductive components 204b and 204c, and a negative terminal 103b and a positive terminal 103a of the set 103 are respectively connected to the conductive components 204c and 204d. Thus, each of the sets 102 and 103 of photovoltaic cells is respectively connected in parallel with a bypass diode 202 and a bypass diode 203.

1.2 Photovoltaic Power Generation System

Figure 3:
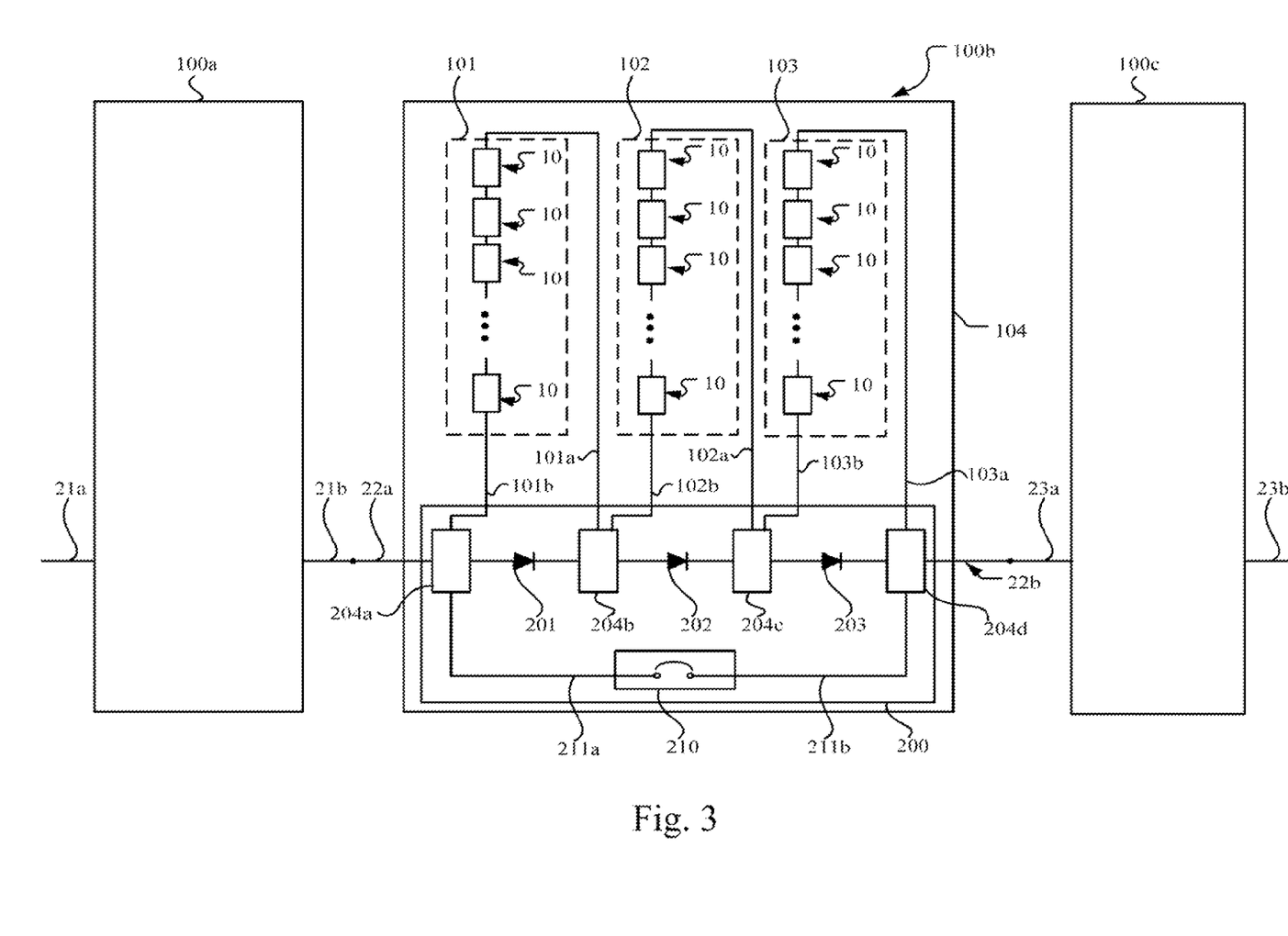
FIG. 3 is a block diagram of an exemplary embodiment of a photovoltaic power generation system.

The terminal box 200 comprises two output terminals 221 and 222 electrically connectable to the photovoltaic module 100 to output voltage signals generated by the photovoltaic module 100. The photovoltaic module 100 may connect to other adjacent photovoltaic modules in parallel or in series through connectors at the ends of the output terminals 221 and 222. With reference to FIG. 3, for example, a photovoltaic power generation system comprises photovoltaic modules 100a, 100b, and 100c, each comprising an embodiment of the photovoltaic module 100. Thus, components and component connection of each of the photovoltaic module 100a, 100b, and 100c may be referred to the photovoltaic module 100. Each of the photovoltaic modules 100a and 100c may comprise the same structure and configuration as the photovoltaic modules 100b. The output terminals of terminal boxes 200 in the photovoltaic modules 100a, 100b, and 100c are respectively labeled as 21a and 21b, 22a and 22b, and 23a and 23b.

The terminal box 200 comprises a housing comprising a first surface attached to the second surface of the panel 104 of the photovoltaic module 100b. The terminal box 200 further comprises a base component and a lid facing the base component. The base component and the lid, such as bases 409 and lids 410 in FIGS. 4, 5, 8, and 9, may be made from polymer, such as polyphenylene oxide (PPO), or polycarbonates (PC). The first surface of the housing of the terminal box 200 is formed on the base component and may be affected by operating temperature of the photovoltaic module 100b. The temperature of the first surface of the base component increases when the photovoltaic module 100b is exposed to solar radiation. In one example, the temperature of a photovoltaic module is under 800 watt/m$^2$ irradiance and 1 m/s wind velocity is typically lower than 45° C. A shaded cell in an operating photovoltaic module, such as 100b, referred to as a hot spot becomes reverse biased and dissipates power in the form of heat. A hot spot may reach 90° C. in a normal photovoltaic module and in the worst case, for example due to cell damage, may reach 150° C. to surpass critical temperature of cell encapsulants of the photovoltaic modules 100a, 100b, and 100c. Thus, the upper limit of operating temperature of the photovoltaic module 100b can be set to be lower than 150° C., such as an upper limit of 148° C.

A thermal switch 210 has a terminal 211a electrically connected to the terminal 22a, and a terminal 211b electrically connected to the terminal 22b. OFF and ON positions of the thermal switch 210 respectively represent states in which the thermal switch 210 short-circuits and does not short-circuit the output terminals 22a and 22b. The photovoltaic module 100b with the thermal switch 210 in the ON position provides voltage signals through the output terminals 22a and 22b in response to radiant energy exposure. When the thermal switch 210 is in OFF position, the output terminals 22a and 22b of the photovoltaic module 100b is shorted by the thermal switch 210 in OFF position.

The thermal switch 210 may be disposed in the terminal box 200 to detect and respond to temperature of the terminal box 200. Specifically, the thermal switch 210 may be thermally coupled to a surface of the terminal box 200. For example, a temperature detection portion of the thermal switch 210 is thermally coupled to a second surface of the lid of the terminal box 200 facing the base component. When the temperature of the temperature detection portion of the thermal switch 210 raises to a threshold temperature T, the thermal switch 210 short-circuits the two output terminals 22a and 22b in response to temperature rise of the temperature detection portion, which reflects to the temperature of the second surface of the lid of the terminal box 200. Since house fires averagely reach approximately 650° C. (approximately 1200° F.), the threshold temperature T is required to be lower than 650° C. For example, the threshold temperature T is approximately 150° C. Additionally, the threshold temperature T of the thermal switch 210 in the terminal box is preset higher than upper limits of operating temperatures of the bypass diodes 201-203 and the photovoltaic module 100b, thus to prevent the thermal switch from erroneous short-circuit due to influence of the temperature rise of the photovoltaic module 100b and the bypass diodes 201-203.

Materials of and connection along the terminal 101b, the component 204a, the terminal 211a, the thermal switch 210, the terminal 211b, and the component 204d, and the terminal 103a are structured to withstand temperature of at least 650° C. For example, materials of the terminal 101b, the component 204a, the terminal 211a, the thermal switch 210, the terminal 211b, and the component 204d, and the terminal 103a comprises copper with melting point of approximately 1083° C. Connection between the terminal 101b, the component 204a, the terminal 211a, the thermal switch 210, the terminal 211b, and the component 204d, and the terminal 103a may be realized by screwing or clamping through screws or clamps made from materials with high melting point, such as copper, iron, stainless steel, nickel-chromium based alloy, and other high temperature resistive material.

2. EXEMPLARY EMBODIMENTS OF THERMAL SWITCHES

The thermal switch 210 may be bistable in the OFF and ON positions and require manual operations to return from the OFF position to the ON position. Alternatively, the thermal switch 210 once switched to the OFF position may be irreversible.

Figure 4:
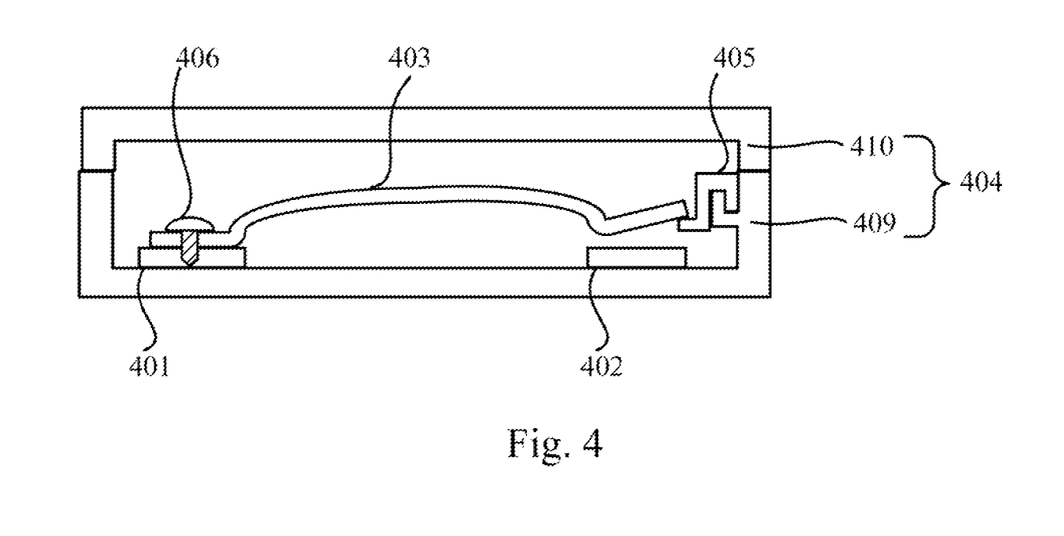
FIG. 4 is a schematic view of a thermal switch of a first embodiment of a photovoltaic terminal box, the thermal switch in an ON position.
Figure 5:
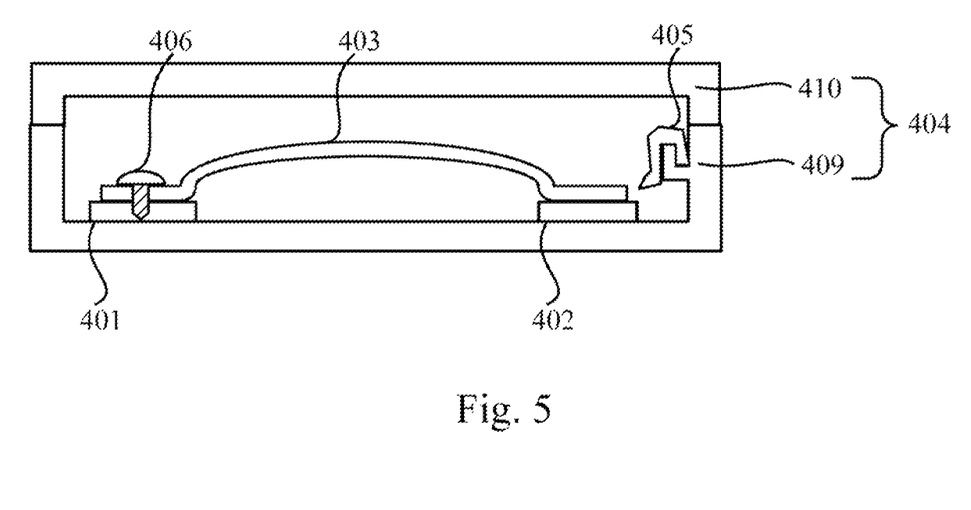
FIG. 5 is a schematic view of a thermal switch of a first embodiment of a photovoltaic terminal box, the thermal switch in an OFF position.
Figure 6:
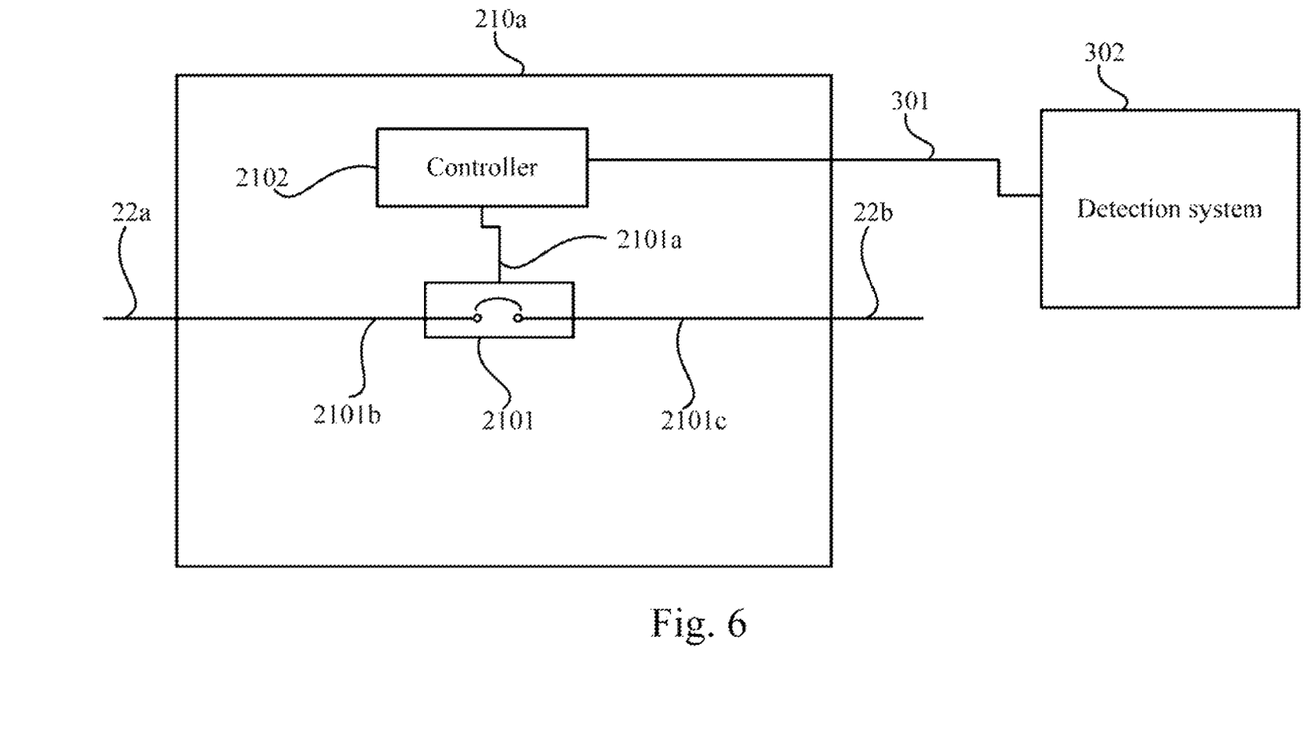
FIG. 6 is a schematic view of a thermal switch of a second embodiment of a photovoltaic terminal box.

2.1 First Exemplary Embodiment of the Terminal Box with Mechanical Thermal Switches FIG. 4 is a cross section of the terminal box 200. Terminals 401 and 402 are a low voltage and a high voltage terminal of the terminal box, respectively. For example, the terminal 401 may electrically connect to or comprise the terminal 101b, 22a, component 204a, or a node portion thereof, and the terminal 402 may electrically connect to or comprise the terminal 103a, 22b, component 204d, or a joint portion thereof. An electrically conductive component 403, such as a metal plate, is fastened on housing 404 of the terminal box 200 with the terminal 401 by a fastening component 406. The electrically conductive component 403 has flexibility to change between a forced state and a released state. As shown in FIG. 6, the electrically conductive component 403 is retained in the forced state by a fuse 405, and has mechanical strength to return to the released state when the retention force of the fuse 405 is removed. As shown in FIG. 5, the electrically conductive component 403 in the released state is electrically in contact with the terminal 402 to short circuit the terminals 401 and 402. The component 403 and the fuse 405 comprise a thermal switch 210 of a first embodiment of a photovoltaic terminal box. The fuse 405 is made up of material, such as tin alloys, or polymer, that loses strength to retain the electrically conductive component 403 in the forced state when heated to the threshold temperature T. Specifically, the fuse 405 releases the electrically conductive component 403 to the released state when heated to the threshold temperature T. For example, the melting point of the fuse 405 is designed to substantially equal the threshold temperature T. Thus, the fuse 405 comprises an exemplary embodiment of the temperature detection portion of the thermal switch 210.

Note that the distance between the terminal 402 and the component 403 in the forced state is larger than clearance distance requirement of the terminal box 200. The fuse 405 may be replaced by a bimetal operable to release the electrically conductive component 403 to the released state when heated to the threshold temperature T.

2.2 Second Exemplary Embodiment of the Terminal Box with Electrical Thermal Switches With reference to FIG. 6, a switch device 210a is another example of a thermal switch 210 in a second embodiment of a photovoltaic terminal box. A switch element 2101 of the switch device 210a may comprise a mechanical or solid state switch or relay with a control terminal 2101a connected to a controller 2102. The switch element 2101 responds to the signal received from the controller 2102 through the control terminal 2101a to electrically disconnect or connect terminals 2101b and 2101c, thus to transit the switch device 210a to the ON or OFF position. The switch element 2101 may be bistable in these two states and require manual operations to return from the OFF position to the ON position. Alternatively, the switch element 2101 once switched to the OFF position may be irreversible.

The controller 2102 may comprise an electric circuit in communication with a detection system 320 through a communication channel 301. The channel 301 may comprise a wired or a wireless communication channel. The detection system 320 may comprise one or more detectors, such as a smoke detector, a thermometer, a combination thereof, or an information computer system incorporating such detectors, operable to issue an alarm signal respondent to a fire incident. The smoke detector issues the alarm signal when detecting spreading smoke. The thermometer is operable to issue the alarm signal when detecting temperature rise to a threshold value. The computer system issues the alarm signal based on data provided by at least one of the thermometer and the smoke detector, such as a density level of smoke, measured temperature, locations or identification of the thermometer and the smoke detector. The detection system 320, for example, may comprise an indoor appliance operable to issue the alarm signal in response to smoke spreading detected by the smoke detector, high temperature detected by the thermometer, or a suspected fire event determined by the computer system based on detected data. The controller 2102 may comprise an integrated circuit (IC). The controller 2102 activates the switch device 210a from the ON position to the OFF position in response to the alarm signal from the indoor system 302 respondent to a fire incident.

If channel 301 comprises a wireless communication channel, the detection system 320 may communicate with the controller 2102 through proprietary communication protocols, ZIGBEE, wireless local area network (LAN) communication, and/or cellular communication, such as wideband code division multiple access (W-CDMA) and high speed downlink packet access (HSDPA).

The controller 2102 may connect to the detection system 320 through a power inverter which converts direct current (DC) signals generated by the photovoltaic power generation system to alternating current (AC) signals. The inverter receives and transfers the alarm signal from the detection system 320 to the controller 2102. The inverter may perform signal analysis on the received alarm signal and convert the alarm signal by generating a version of the alarm signal conforming to a protocol between the inverter and the controller 2102.

Figure 7:
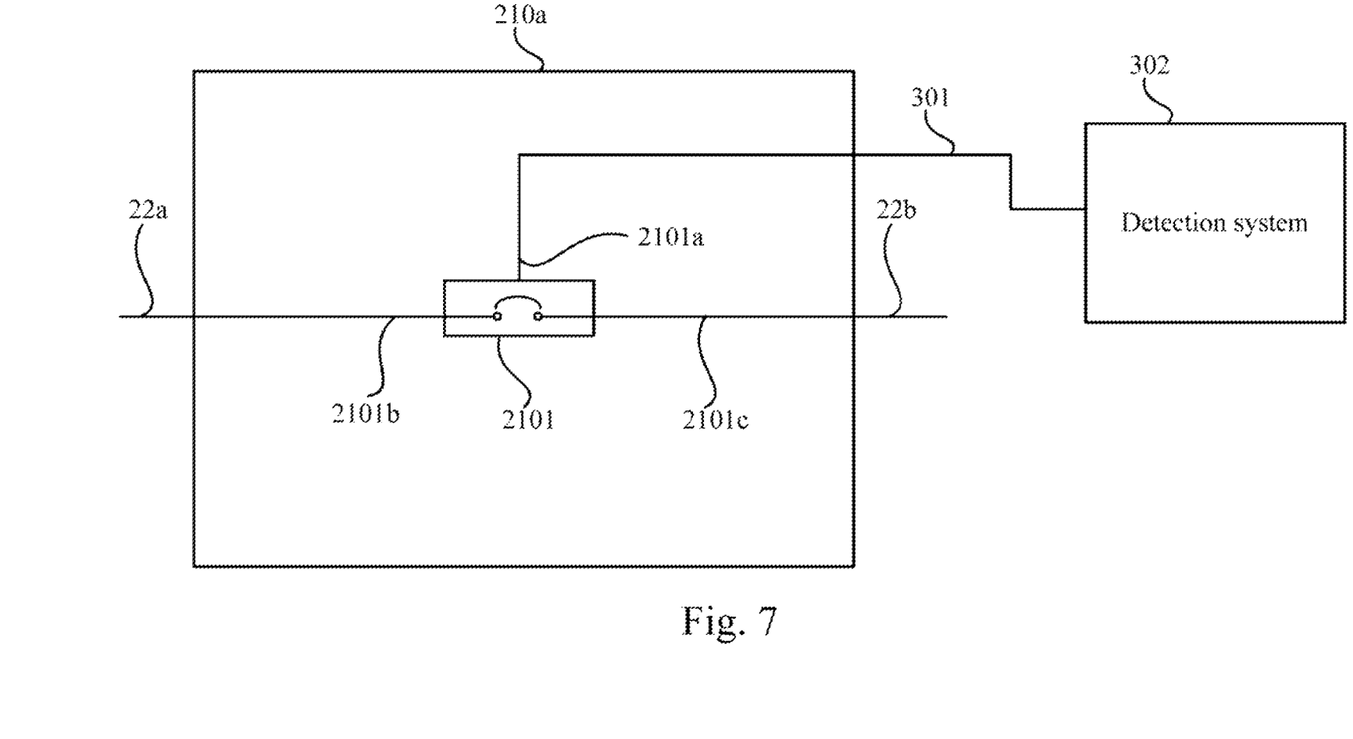
FIG. 7 is a schematic view of a thermal switch of a first embodiment of a photovoltaic terminal box.

2.3 Third Exemplary Embodiment of the Terminal Box with Electrical Thermal Switches FIG. 7 shows switch device 210b of the thermal switch of a third embodiment of a photovoltaic terminal box, differing from switch device 210a only in that the detection system 320 directly energizes and controls the switch element 2101 to switch from the ON position to the OFF position through the alarm signal respondent to a fire incident.

The switch element 2101 may connect to the detection system 320 through a power inverter which converts direct current (DC) signals generated by the photovoltaic power generation system to alternating current (AC) signals. The inverter receives and transfers the alarm signal from the detection system 320 to the switch element 2101. The inverter may perform signal analysis on the received alarm signal and convert the alarm signal by generating a version of the alarm signal conforming to a protocol between the inverter and the switch element 2101.

The terminal box 200 may include at least two of the exemplary embodiments of the thermal switches in the housing thereof. The thermal switch 210 may comprise at least two of the exemplary embodiments of the thermal switches.

3. ALTERNATIVE EMBODIMENTS

Figure 8:
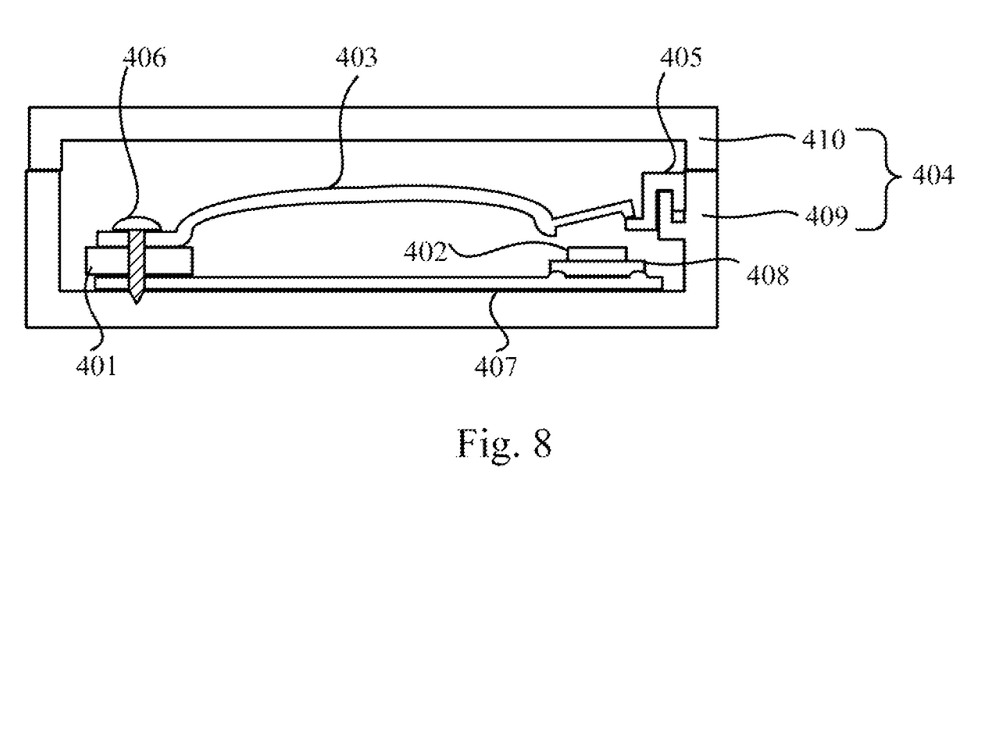
FIG. 8 is a schematic view of a thermal switch of a fourth embodiment of a photovoltaic terminal box, the thermal switch in an ON position.

Material strength of the thermal switch 210 component 403 may be designed to retain the terminals 401 and 402 in connection even if the housing of the terminal box 200 is deformed by high temperature. With reference to FIG. 8, the thermal switch 210 further comprises components 407 and 408. The component 408 is a dielectric insulator and may be replaced by dielectric sheathing of the component 407. The components 403 and 407 comprises recesses structured to receive the terminal 402 and may be made from materials with melting point higher than 650° C., such as copper, iron, stainless steel, or nickel-chromium based alloy. The component 407 may be made from dielectric material.

Figure 9:
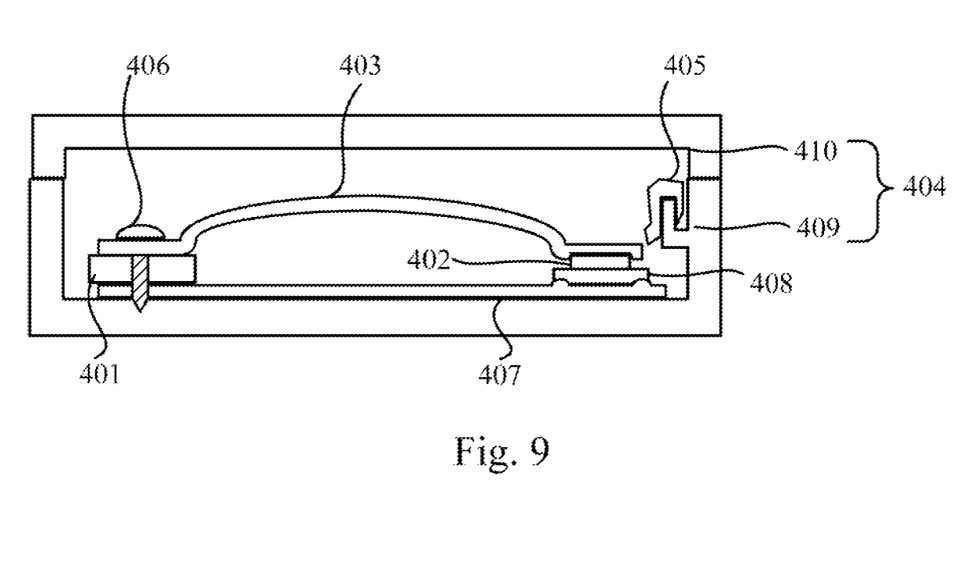
FIG. 9 is a schematic view of a thermal switch of a fourth embodiment of a photovoltaic terminal box, the thermal switch in an OFF position.

The thermal switch 210 as shown in FIG. 8 is in the ON position with the component 403 in the forced state. The thermal switch 210 as shown in FIG. 9 is in the OFF position with the component 403 in the released state. The components 403 and 407 provide retention force to hold the terminals 401 and 402 in connection in response to removal of retention force of the fuse 405. Material strength of the components 403 and 407 component 403 is designed to retain the terminals 401 and 402 in connection even if the housing of the terminal box 200 is deformed by high temperature.

4. CONCLUSION

In conclusion, the photovoltaic system terminal box is equipped with a thermal switch to reduce voltage generated by a photovoltaic module to which the photovoltaic system terminal box is attached and connected when detecting the threshold temperature T. The threshold temperature T of the thermal switch in the terminal box is preset higher than upper limits of operating temperatures of the bypass diode and the photovoltaic module, thus to prevent the thermal switch from erroneous short-circuit due to influence of the temperature rise of the photovoltaic module and the bypass diode.

It is to be understood, however, that even though numerous characteristics and advantages of the disclosure have been set forth in the foregoing description, together with details of the structure and function of the present disclosure, the disclosure is illustrative only, and changes may be made in detail, especially in matters of shape, size, and arrangement of parts within the principles of the present disclosure to the full extent indicated by the broad general meaning of the terms in which the appended claims are expressed.

What is claimed is:

1. A thermostatically controlled terminal box, comprising:
a housing comprising a base with a first surface structured to be attachable to a photovoltaic module, wherein temperature of the first surface increases when the photovoltaic module is exposed to solar radiation;
a bypass diode disposed in the housing and structured to be electrically connectable to a set of photovoltaic cells in the photovoltaic module, wherein temperature of the bypass diode increases when the set of photovoltaic cells is shaded from the solar radiation;
two output terminals structured to be electrically connectable to the photovoltaic module to output voltage generated by the photovoltaic module; and
a thermal switch comprising two terminals electrically connected to the two output terminals, operable to detect temperature rise of the terminal box to a threshold temperature and short-circuit the two output terminals in response to the temperature rise of the terminal box to the threshold temperature, wherein the terminal box is structured to prevent the thermal switch from erroneous short-circuit due to influence of the temperature rise of the first surface and the bypass diode.

2. The thermostatically controlled terminal box as claimed in claim 1, wherein the threshold temperature of the thermal switch in the terminal box is preset higher than upper limits of operating temperatures of the bypass diode and the photovoltaic module.

3. The thermostatically controlled terminal box as claimed in claim 1, wherein the thermal switch is irreversible in transition from an ON position to an OFF position, the thermal switch does not short-circuit the two output terminals in the ON position and short-circuits the two output terminals in the OFF.

4. The thermostatically controlled terminal box as claimed in claim 1, wherein the thermal switch comprises an electrically conductive component operable to short-circuit the two output terminals in a released state, the electrically conductive component is retained in a forced state by a fuse operable to release the electrically conductive component to the released state when heated to the threshold temperature.

5. The thermostatically controlled terminal box as claimed in claim 3, wherein the fuse comprises tin.

6. A thermostatically controlled terminal box, comprising:
a housing comprising a base with a first surface structured to be attachable to a photovoltaic module;
a bypass diode disposed in the housing and structured to be electrically connectable to a set of photovoltaic cells in the photovoltaic module;
two output terminals structured to be electrically connectable to the photovoltaic module to output voltage generated by the photovoltaic module; and
a thermal switch comprising two terminals electrically connected to the two output terminals and a control terminal operable to be electrically connected to a detection system, the thermal switch detects alarm signal received through the control terminal respondent to a fire incident and short-circuits the two output terminals in response to the alarm signal.

7. The thermostatically controlled terminal box as claimed in claim 6, wherein the detection system comprises an indoor appliance.

8. The thermostatically controlled terminal box as claimed in claim 7, wherein the detection system comprises a thermometer operable to issue the alarm signal when detecting temperature rise to a threshold value.

9. The thermostatically controlled terminal box as claimed in claim 7, wherein the detection system comprises a smoke detector operable to issue the alarm signal when detecting spreading smoke.

10. The thermostatically controlled terminal box as claimed in claim 7, wherein the detection system comprises a computer system operable to issue the alarm signal based on data provided by at least one of a thermometer and a smoke detector.

11. The thermostatically controlled terminal box as claimed in claim 6, wherein the thermal switch is irreversible in transition from an ON position to an OFF position, the thermal switch does not short-circuit the two output terminals in the ON position and short-circuits the two output terminals in the OFF position.

12. The thermostatically controlled terminal box as claimed in claim 6, wherein the thermal switch connects to the detection system through an inverter operable to convert direct current (DC) signals generated by the photovoltaic module to alternating current (AC) signals.

13. The thermostatically controlled terminal box as claimed in claim 6, wherein the thermal switch connects to the detection system through a controller, and the controller connects to the detection system through a wireless communication channel.

14. A photovoltaic power generation system, comprising:
a photovoltaic module; and
a terminal box comprising:
a housing comprising a base with a first surface structured to be attachable to the photovoltaic module, wherein temperature of the first surface increases when the photovoltaic module is exposed to solar radiation;
a bypass diode disposed in the housing and structured to be electrically connectable to a set of photovoltaic cells in the photovoltaic module, wherein temperature of the bypass diode increases when the set of photovoltaic cells is shaded from the solar radiation;
two output terminals structured to be electrically connectable to the photovoltaic module to output voltage generated by the photovoltaic module; and
a thermal switch comprising two terminals electrically connected to the two output terminals, operable to detect and respond to temperature rise of the terminal box to a threshold temperature to short-circuit the two output terminals, wherein the terminal box is structured to prevent the thermal switch from erroneous short-circuit due to influence of the temperature rise of the first surface and the bypass diode.

15. The photovoltaic power generation system as claimed in claim 14, wherein the threshold temperature of the thermal switch in the terminal box is preset higher than upper limits of operating temperatures of the bypass diode and the photovoltaic module.

16. The photovoltaic power generation system as claimed in claim 15, wherein the threshold temperature of the thermal switch in the terminal box is preset lower than 650° C.

17. The photovoltaic power generation system as claimed in claim 14, wherein the thermal switch, after changing from an ON position to an OFF position, is irreversible, the thermal switch does not short-circuit the two output terminals in the ON position and short-circuits the two output terminals in the OFF position.

18. The photovoltaic power generation system as claimed in claim 17, wherein the thermal switch comprises an electrically conductive component operable to short-circuit the two output terminals in a released state, the electrically conductive component is retained in a forced state by a fuse operable to release the electrically conductive component to the released state when heated to the threshold temperature.

19. The photovoltaic power generation system as claimed in claim 18, wherein the fuse comprises tin.

20. The photovoltaic power generation system as claimed in claim 18, wherein the thermal switch comprises a control terminal operable to be electrically connected to a detection system, and the thermal switch detects an alarm signal received through the control terminal respondent to a fire incident and short-circuits the two output terminals in response to the alarm signal.

* * * * *